(12) United States Patent
Chiang et al.

(10) Patent No.: US 11,043,567 B2
(45) Date of Patent: Jun. 22, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Hsin-Che Chiang, Taipei (TW); Ju-Yuan Tzeng, New Taipei (TW); Chun-Sheng Liang, Changhua County (TW); Chih-Yang Yeh, Hsinchu County (TW); Shu-Hui Wang, Hsinchu (TW); Jeng-Ya David Yeh, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/115,390

(22) Filed: Aug. 28, 2018

(65) Prior Publication Data
US 2019/0165117 A1     May 30, 2019

Related U.S. Application Data

(60) Provisional application No. 62/593,109, filed on Nov. 30, 2017.

(51) Int. Cl.
| *H01L 29/423* | (2006.01) |
| *H01L 29/66* | (2006.01) |
| *H01L 29/78* | (2006.01) |
| *H01L 29/49* | (2006.01) |
| *H01L 21/28* | (2006.01) |
| *H01L 29/165* | (2006.01) |
| *H01L 29/51* | (2006.01) |

(52) U.S. Cl.
CPC .. *H01L 29/42372* (2013.01); *H01L 21/28088* (2013.01); *H01L 29/4966* (2013.01); *H01L 29/66545* (2013.01); *H01L 29/66795* (2013.01); *H01L 29/7851* (2013.01); *H01L 29/165* (2013.01); *H01L 29/517* (2013.01); *H01L 29/7843* (2013.01); *H01L 29/7848* (2013.01)

(58) Field of Classification Search
CPC ......... H01L 29/42372; H01L 29/66795; H01L 29/7851; H01L 29/7848; H01L 29/165; H01L 29/517; H01L 29/7843; H01L 29/4966; H01L 21/28088
USPC ....................................................... 257/401
See application file for complete search history.

(56) References Cited

U.S. PATENT DOCUMENTS

| 9,490,255 B1 * | 11/2016 | Edge ..................... H01L 21/845 |
| 9,640,540 B1 * | 5/2017 | Liaw ..................... G11C 11/419 |
| 2011/0140207 A1 * | 6/2011 | Lin .................. H01L 21/28088 |
| | | 257/412 |

(Continued)

*Primary Examiner* — Igwe U Anya
(74) *Attorney, Agent, or Firm* — Maschoff Brennan

(57) ABSTRACT

A semiconductor device includes a substrate, a gate stack. The substrate includes a semiconductor fin. The gate stack is disposed on the semiconductor fin. The gate stack includes a dielectric layer disposed over the semiconductor fin, and a metal stack disposed over the dielectric layer and having a first metallic layer and a second metallic layer over the first metallic layer, and a gate electrode disposed over the metal stack. The first metallic layer and the second metallic layer have a first element, and a percentage of the first element in the first metallic layer is greater than that in the second metallic layer.

20 Claims, 11 Drawing Sheets

(56) References Cited

U.S. PATENT DOCUMENTS

| | | | |
|---|---|---|---|
| 2012/0119204 A1* | 5/2012 | Wong | H01L 21/823842 |
| | | | 257/43 |
| 2015/0035073 A1* | 2/2015 | Ando | H01L 29/513 |
| | | | 257/369 |
| 2016/0365347 A1* | 12/2016 | Bao | H01L 21/32139 |
| 2017/0032972 A1* | 2/2017 | Tsai | H01L 21/321 |
| 2017/0125298 A1* | 5/2017 | Jangjian | H01L 21/82345 |
| 2018/0374926 A1* | 12/2018 | Lee | H01L 27/088 |

* cited by examiner

SEMICONDUCTOR DEVICE AND MANUFACTURING METHOD THEREOF

PRIORITY CLAIM AND CROSS-REFERENCE

This application claims priority to U.S. Provisional Application Ser. No. 62/593,109, filed Nov. 30, 2017, which is herein incorporated by reference.

BACKGROUND

The semiconductor integrated circuit (IC) industry has experienced rapid growth. In the course of IC evolution, functional density (i.e., the number of interconnected devices per chip area) has increased while geometry size (i.e., the smallest component (or line) that can be created using a fabrication process) has decreased. This scaling down process increases production efficiency and lowers associated costs.

Such scaling down has also increased the complexity of processing and manufacturing ICs and, for these advances to be realized, similar developments in IC processing and manufacturing are desired. For example, a three dimensional transistor, such as a fin-like field-effect transistor (FinFET), has been introduced to replace a planar transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
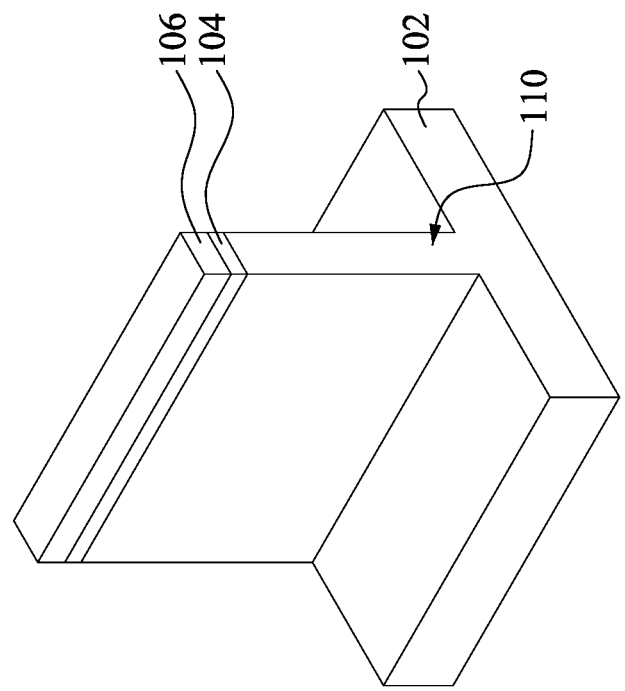
FIGS. 1A to 1P are cross-sectional views of various stages of a method of manufacturing a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
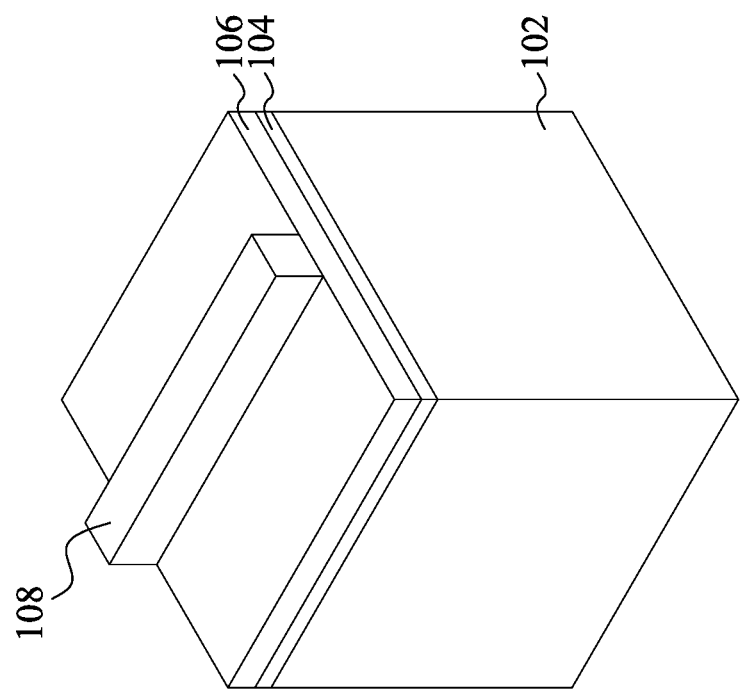
Figure 1D:
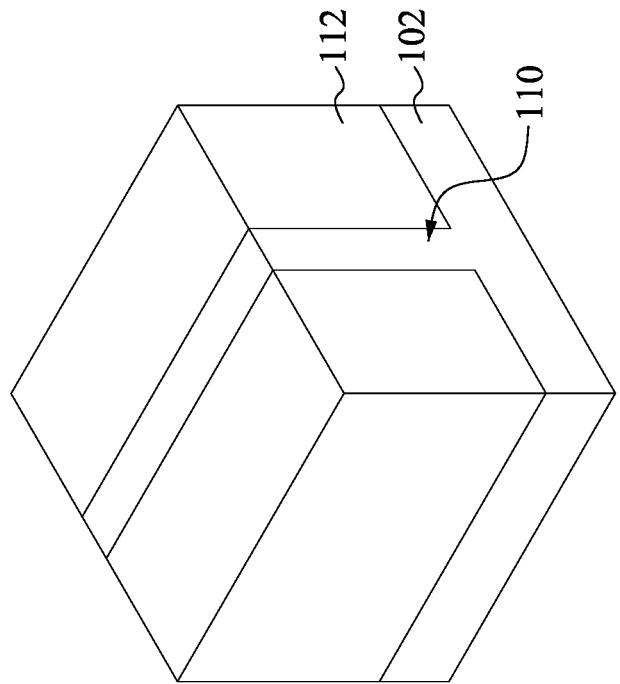
Figure 1C:
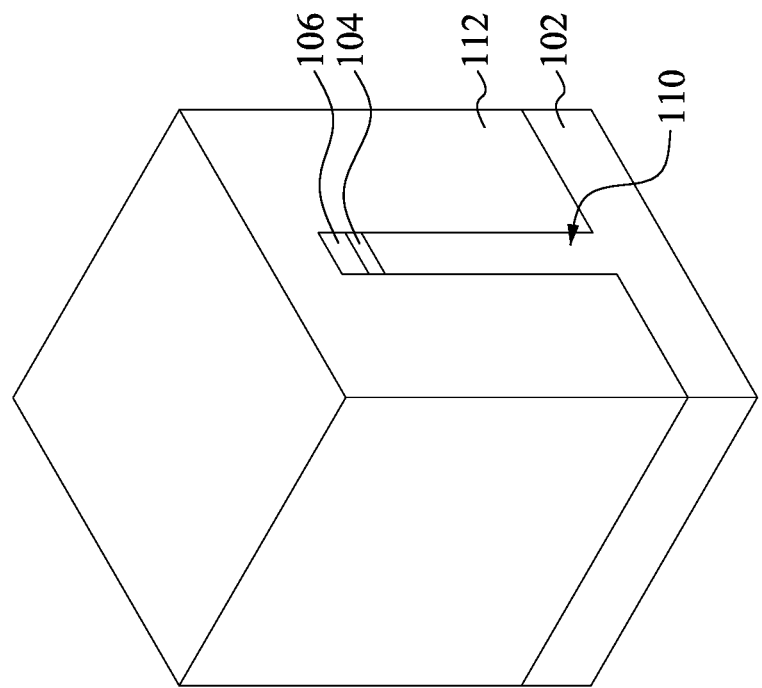
Figure 1F:
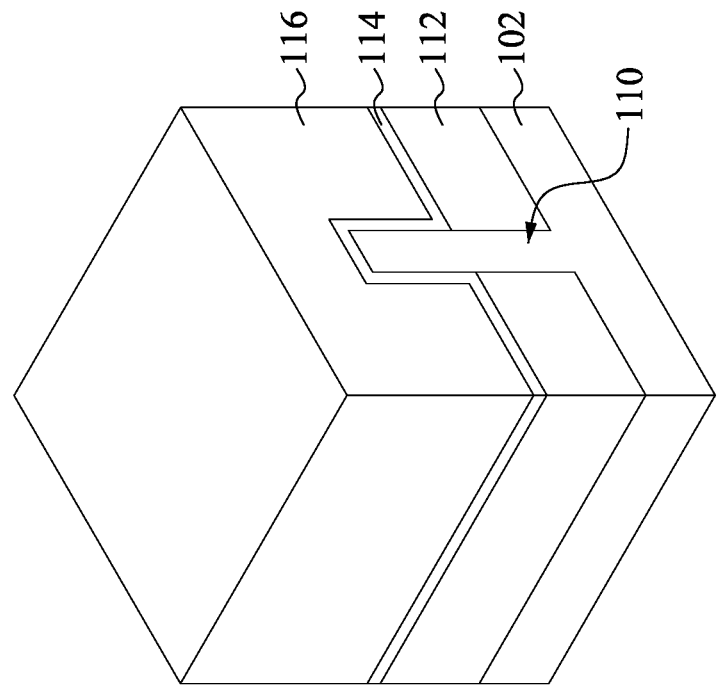
Figure 1E:
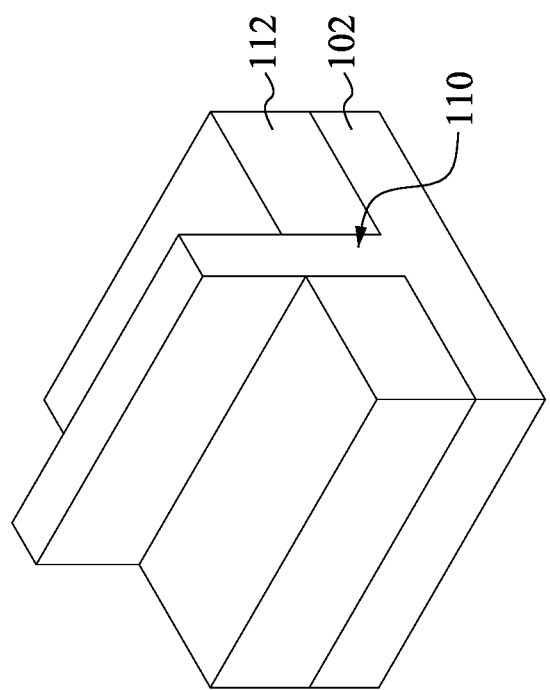
Figure 1H:
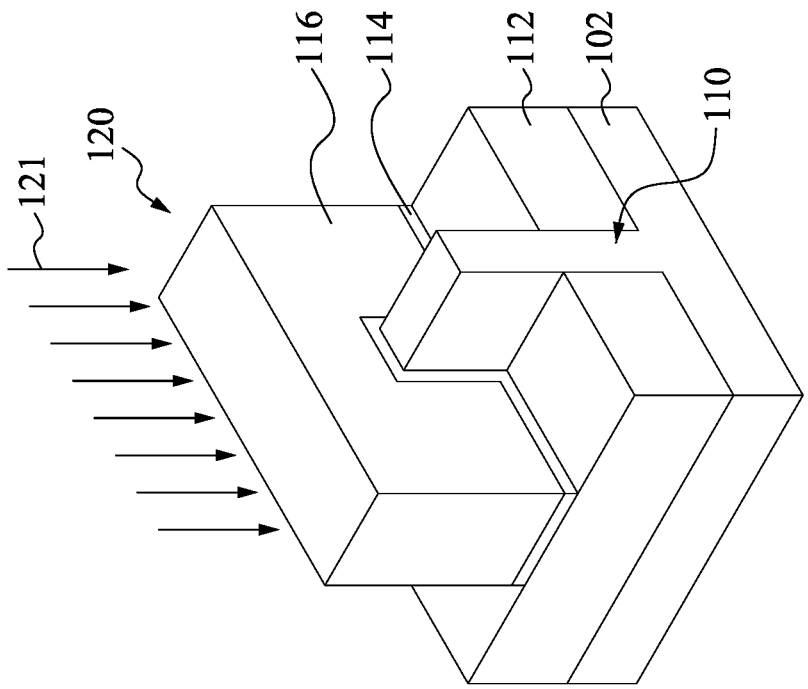
Figure 1G:
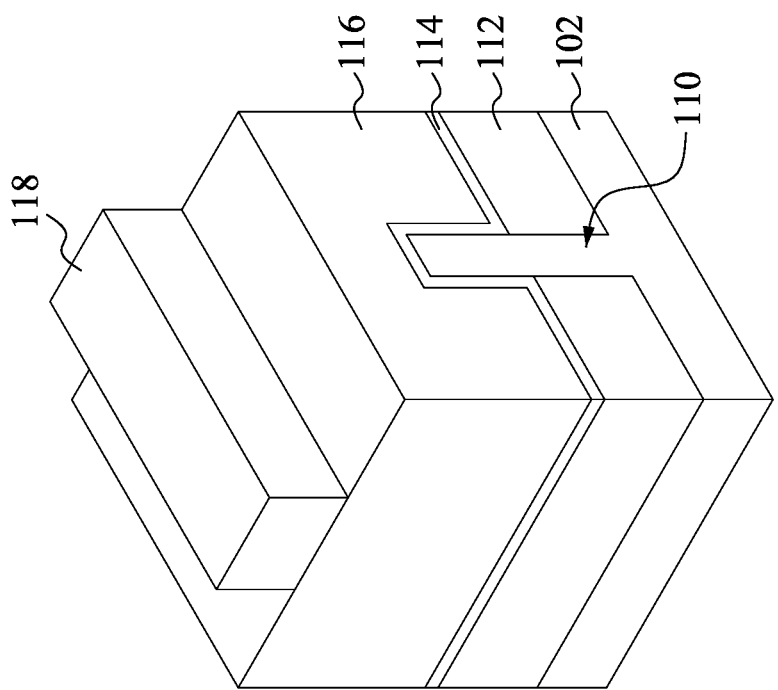
Figure 1J:
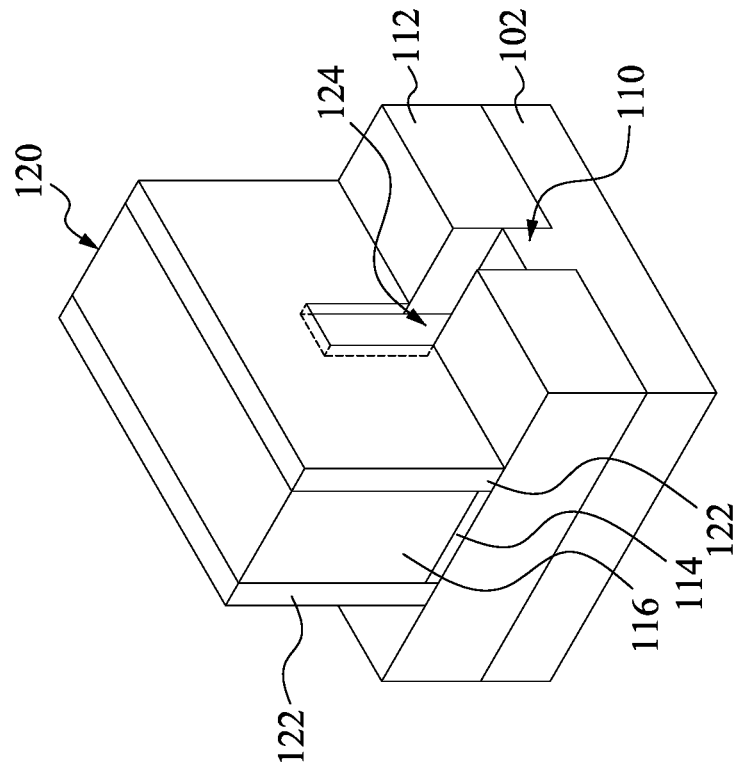
Figure 1I:
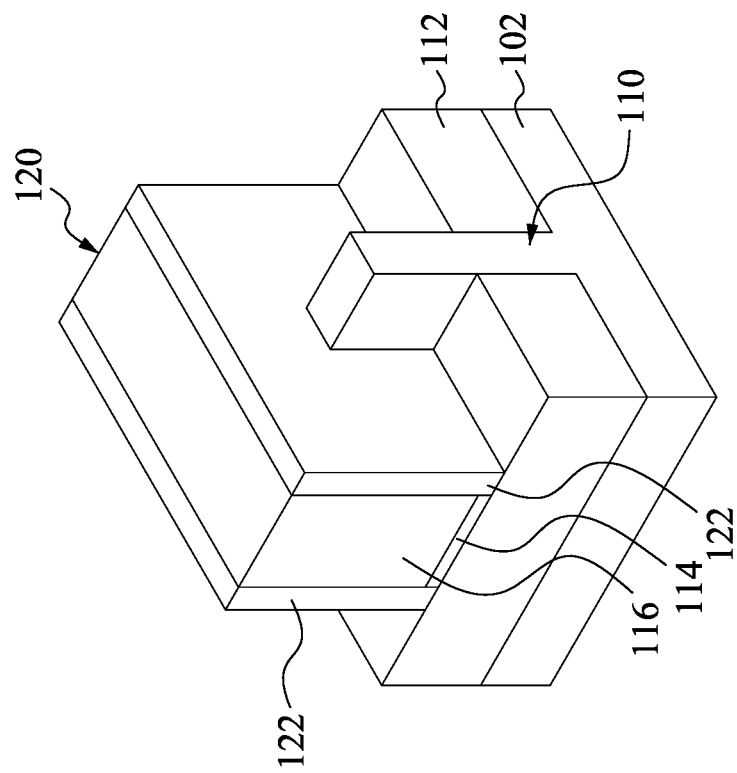
Figure 1L:
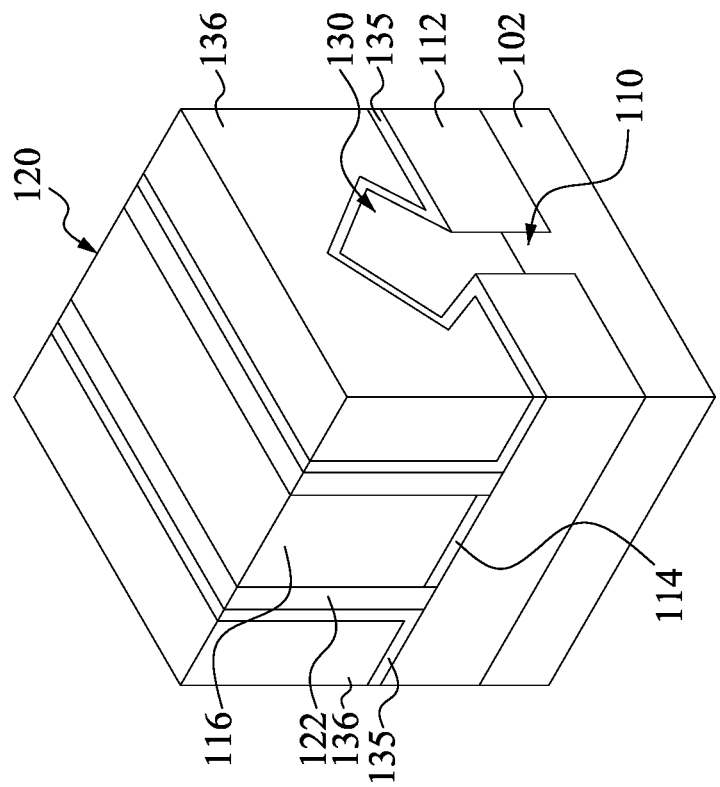
Figure 1K:
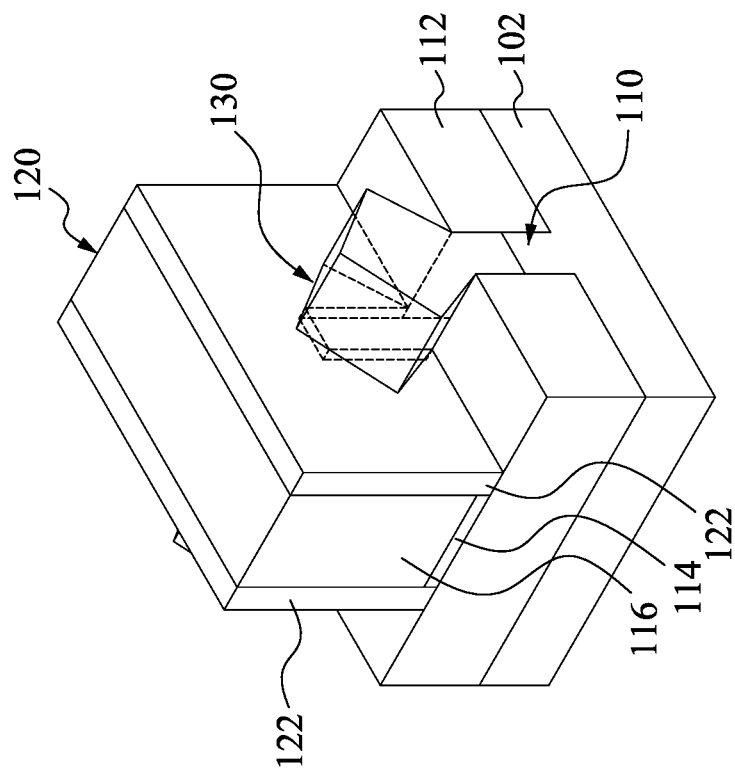
Figure 1M:
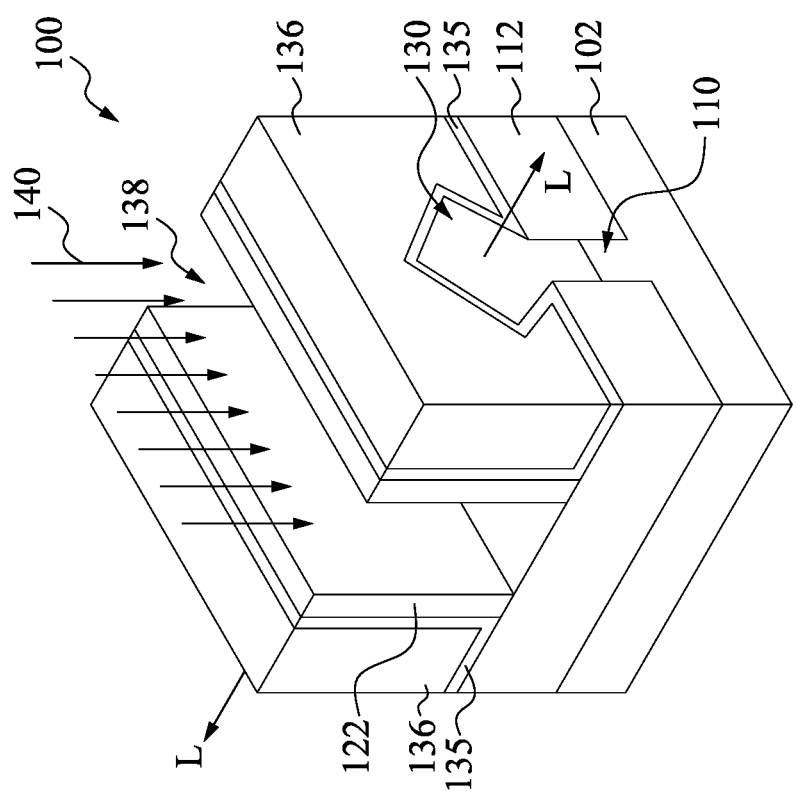
Figure 1O:
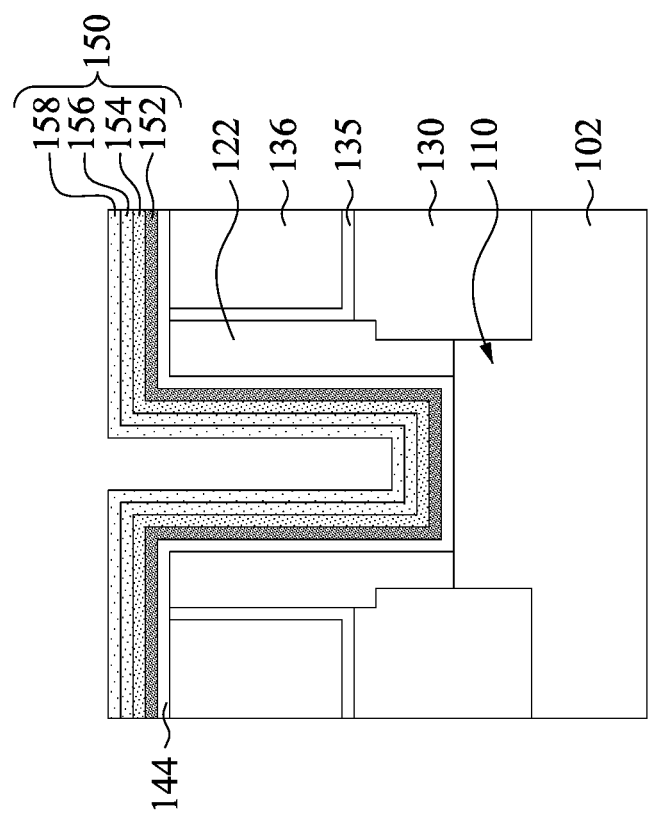
Figure 1N:
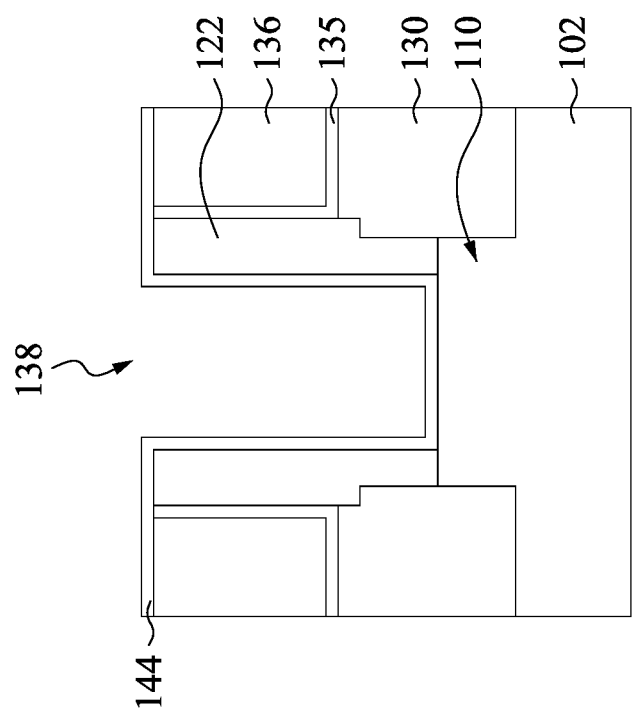
Figure 1P:
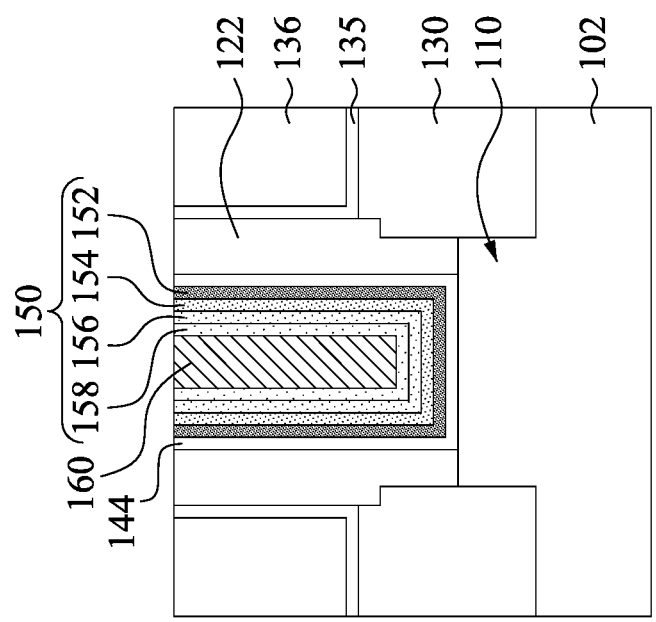

FIGS. 1A to 1P are cross-sectional views of various stages of a method of manufacturing a semiconductor device in accordance with some embodiments. In some embodiments, the semiconductor structure shown in FIGS. 1A to 1P may be intermediate devices fabricated during processing of an integrated circuit (IC), or a portion thereof, that may include static random access memory (SRAM), logic circuits, passive components such as resistors, capacitors, and inductors, and/or active components such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

As shown in FIG. 1A, a substrate 102 is provided in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

A dielectric layer 104 and a mask layer 106 are formed over the substrate 102, and a photo-sensitive layer 108 is formed over the mask layer 106, as shown in FIG. 1A in accordance with some embodiments. The dielectric layer 104 may be used as an adhesion layer between the substrate 102 and the mask layer 106. In addition, the dielectric layer 104 may also be used as an etch stop layer for etching the mask layer 106. In some embodiments, the dielectric layer 104 is made of silicon oxide. The dielectric layer 104 may be formed by using a thermal oxidation process, although other deposition processes may be used in some other embodiments.

The mask layer 106 may be used as a hard mask during subsequent photolithography processes. In some embodiments, the mask layer 106 is made of silicon nitride. The mask layer 106 may be formed by using low-pressure chemical vapor deposition (LPCVD) or plasma enhanced chemical vapor deposition (PECVD), although other deposition processes may also be used in some other embodiments. Furthermore, the photo-sensitive layer 108 may be a photoresist.

Reference is made to FIG. 1B. The mask layer 106, the dielectric layer 104, and the substrate 102 are patterned using the photo-sensitive layer 108 as a mask by performing at least one etching process. As such, the substrate 102 is patterned to form a fin structure 110. After the patterning process, the photo-sensitive layer 108 is removed.

Reference is made to FIG. 1C. An insulating layer 112 is formed over the substrate 102 to cover the fin structure 110, the mask layer 106, and the dielectric layer 104. In some embodiments, the insulating layer 112 is made of silicon oxide, silicon nitride, silicon oxynitride, fluoride-doped silicate glass (FSG), or other low-K dielectric materials. The insulating layer 112 may be formed by using a high-density-plasma (HDP) CVD process, although other deposition processes may be used in other embodiments.

Reference is made to FIG. 1D. A planarization process is performed to remove the mask layer 106 and the dielectric layer 104, such that the fin structure 110 is exposed. In some embodiments, the planarization process is a chemical-mechanical polishing (CMP) process. The planarization process also removes portions of the insulating layer 112, such that the top surface of the remaining insulating layer 112 is flush with the top surface of the fin structure 110.

Reference is made to FIG. 1E. The insulating layer 112 is recessed to expose a top portion of the fin structure 110. The insulating layer 112 may be recessed by a wet etching process or a dry etching process. In some embodiments, the remaining insulating layer 112 may also be referred to as shallow trench isolation (STI) structures.

Reference is made to FIG. 1F. A gate dielectric layer 114 is formed over the substrate 102 to cover the fin structure 110 and the insulating layer 112. In some embodiments, the gate dielectric layer 114 may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2.Al_2O_3$) alloy, or other applicable dielectric materials. In some embodiments, the gate dielectric layer 114 is an oxide layer.

The gate dielectric layer 114 may be formed by a deposition processes, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). In some embodiments, the gate dielectric layer 114 may be used to prevent damage to the fin structure 110 in subsequent processing (e.g., subsequent formation of the dummy gate structure).

A sacrificial layer 116 is formed over the gate dielectric layer 114, as shown in FIG. 1F in accordance with some embodiments. The sacrificial layer 116 may be formed by a deposition processes, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). The sacrificial layer 116 may be made of conductive or non-conductive materials, such as metals, silicon containing materials, or dielectric materials. In some embodiments, sacrificial layer 116 is made of polysilicon.

In FIG. 1G, a mask structure 118 is formed over a portion of the sacrificial layer 116. The mask structure 118 may be referred to as a hard mask for protecting the sacrificial layer 116 and the gate dielectric layer 114 formed underneath during subsequent processes, such as photolithography processes. The mask structure 118 may be formed by a procedure including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Reference is made to FIG. 1H. An etching process 121 is performed to form a dummy gate structure 120, and the mask structure 118 (referring to FIG. 1G) is removed after the etching process 121. The dummy gate structure 120 includes the portions of the sacrificial layer 116 and the gate dielectric layer 114 positioned below the mask structure 118. The sacrificial layer 116 may be referred to as a dummy gate electrode layer in the dummy gate structure 120, and the gate dielectric layer 114 may be referred to as a dummy gate dielectric layer in the dummy gate structure 120. By performing the etching process 121, the portions of the sacrificial layer 116 and the gate dielectric layer 114 not covered by the mask structure 118 are removed. As shown in FIG. 1H, after the etching process 121, portions of the fin structure 110 are exposed from the dummy gate structure 120.

Reference is made to FIG. 1I. Spacers 122 are formed on opposite sidewalls of the dummy gate structure 120. In some embodiments, the spacers 122 are made of silicon nitride, silicon carbide, silicon oxynitride, silicon carbon, silicon oxide, silicon hydrogen, other applicable materials, or combinations thereof. In some embodiments, spacers 122 are made of nitride. Spacers 122 may be formed by deposition and etching processes.

Reference is made to FIG. 1J. Recesses 124 are formed in the fin structure 110 and at opposite sides of the dummy gate structure 120 by etching the fin structure 110. The dummy gate structure 120 and the spacers 122 act as an etching mask in the formation of the recesses 124. The etching process includes a dry etching process, a wet etching process, or combinations thereof. The dry and wet etching processes have etching parameters that can be adjusted (tuned), such as etchants used, etching temperature, etching solution concentration, etching pressure, source power, radio frequency (RF) bias voltage, RF bias power, etchant flow rate, and other suitable parameters.

Reference is made to FIG. 1K. Source/drain (S/D) structures 130 are respectively formed in the recesses 124. In some embodiments, the source/drain structures 130 are strained source/drain structures. In some embodiments, the source/drain structures 130 are formed by growing a strained material in the recesses 124 of the fin structure 110 by an epitaxial (epi) process. In addition, the lattice constant of the strained material may be different from the lattice constant of the substrate 102. In some embodiments, the source/drain structures 130 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the substrate 102 (e.g., silicon). The source/drain structures 130 may be in-situ doped. The doping species include P-type dopants, such as boron or $BF_2$; N-type dopants, such as phosphorus or arsenic; and/or other suitable dopants including combinations thereof. If the source/drain structures 130 are not in-situ doped, a second implantation process (i.e., a junction implant process) is performed to dope the source/drain structures 130. One or more annealing processes may be performed to activate the source/drain structures 130. The annealing processes include rapid thermal annealing (RTA) and/or laser annealing processes.

Reference is made to FIG. 1L. A contact etch stop layer (CESL) 135 is formed to cover the structure of FIG. 1K (i.e., the dummy gate structure 120, the source/drain structures 130, and the substrate 102.) In some embodiments, the contact etch stop layer 135 can be a stressed layer or layers. In some embodiments, the contact etch stop layer 135 has a tensile stress and is formed of Si3N4. In some other embodiments, the contact etch stop layer 135 includes materials such as oxynitrides. In yet some other embodiments, the contact etch stop layer 135 may have a composite structure including a plurality of layers, such as a silicon nitride layer overlying a silicon oxide layer. The contact etch stop layer 135 may be formed by plasma enhanced CVD, low pressure CVD, ALD, or other applicable processes.

An inter-layer dielectric (ILD) layer 136 is formed over the contact etch stop layer 135 in accordance with some embodiments. The inter-layer dielectric layer 136 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The inter-layer dielectric layer 136 may be formed by chemical vapor deposition (CVD), physical vapor deposition, (PVD), atomic layer deposition (ALD), spin-on coating, or other applicable processes.

Afterwards, a polishing process is performed to the inter-layer dielectric layer 136 and the contact etch stop layer 135. In some embodiments, the inter-layer dielectric layer 136 and the contact etch stop layer 135 are planarized by a chemical mechanical polishing (CMP) process until the top surface of the dummy gate structure 120 is exposed.

Reference is made to FIG. 1M. The dummy gate structure 120 (referring to FIG. 1L) is replaced by a metal gate structure in accordance with some embodiments. The dummy gate structure 120 is removed to form a trench 138 between the spacers 122. In some embodiments, the dummy gate structure 120 is removed by performing a first etching process (not shown) and performing a second etching process after the first etching process. In some embodiments, the sacrificial layer 116 (referring to FIG. 1K) of the dummy gate structure 120 is removed by the first etching process, and the gate dielectric layer 114 (referring to FIG. 1L) of the dummy gate structure 120 is removed by the second etching process. In some embodiments, the first etching process is a dry etching process and the second etching process is a wet etching process 140, as shown in FIG. 1M. Wet etching process 140 may be applied to remove the gate dielectric layer 114 (referring to FIG. 1L), such that the metal gate formed afterwards can be formed on the fin structure 110 and the insulating layer 112.

Reference is made to FIG. 1N. A high-k dielectric layer 144 is formed over the substrate 102 and in the trench 138. In some embodiments, the high-k dielectric layer 144 is conformal to the spacers 122 and the fin structure 110. In some embodiments, the high-k dielectric layer 144 may be formed by suitable processes, such as CVD, PVD, or ALD.

In some embodiments, the high-k dielectric layer 144 is made of metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials. The high-k dielectric layer 144 may also be referred to as gate dielectric layer 144.

Reference is made to FIG. 1O. A metal stack 150 is formed over the high-k dielectric layer 144. The metal stack 150 includes multiple layers. For example, in FIG. 1O, the metal stack 150 includes a first metallic layer 152, a second metallic layer 154 over the first metallic layer 152, a third metallic layer 156 over the second metallic layer 154, and a fourth metallic layer 158 over the third metallic layer 156. It is understood that the number of layers of the metal stack 150 used in this example is chosen to facilitate description, and the present disclosure is not limited thereto. In some other embodiments, the number of layers of the metal stack 150 may be 2, 3, 5, or more. In some embodiments, the metallic layers 152 to 158 may be formed by a suitable process, such as CVD, PVD, or ALD. The metallic layers 152 to 158 may have thicknesses in a range from about 5 Å to about 15 Å.

In some embodiments, the metallic layers 152 to 158 have composition $X_a Y_{1-a}$, in which X, Y are elements, and a, 1-a are concentration percentages of the elements X and Y, respectively. In some embodiments, elements X and Y are different, and may be selected from Hf, Ti, Ta, W, Si, Co, Mo, N, O, So, Ge, P, B, Ga, As, La, Al, Cu, or S. Since the metallic layers 152 to 158 have elements X and Y, the metallic layers 152 to 158 may be formed in the same chamber, in some embodiments. That is, the deposition processes for forming the metallic layers 152 to 158 are in-situ deposition processes without breaking vacuum of the deposition chamber.

In some embodiments, the composition of the metal stack 150 is non-uniform. In other words, the metal stack 150 has discontinuous composition. In FIG. 1O, the composition of the first metallic layer 152 is $X_{a1} Y_{1-a1}$, the composition of the second metallic layer 154 is $X_{a2} Y_{1-a2}$, the composition of the third metallic layer 156 is $X_{a3} Y_{1-a3}$, and the composition of the fourth metallic layer 158 is $X_{a4} Y_{1-a4}$, in which a1, a2, a3, a4 range from 0 to 1. In some embodiments, the percentages a1 to a4 satisfy a1>a2>a3>a4. Stated another way, the percentage of the element X of the metal stack 150 gradually decreases from the metallic layer 152 to the metallic layer 158. Alternatively, the percentage of the element X of the metal stack 150 gradually decreases from the bottommost layer to the topmost layer of the metal stack 150. On the other hand, the percentage of the element Y of the metal stack 150 gradually increases from the metallic layer 152 to the metallic layer 158. That is, the percentage of the element Y of the metal stack 150 gradually increases from the bottommost layer to the topmost layer of the metal stack 150. Accordingly, the metal stack 150 has a gradient composition.

For example, in some embodiments, the first metallic layer 152 may be $X_1 X_0$, the second metallic layer 154 may be $X_{0.8} Y_{0.2}$, the third metallic layer 156 may be $X_{0.6} Y_{0.4}$, and the fourth metallic layer 158 may be $X_{0.4} Y_{0.6}$. In some other embodiments, the metal stack 150 may include more than four layers, and the compositions from the bottommost layer to the topmost layer of the metal stack 150 may gradually change from $X_{a'}Y_{1-a'}$ to $X_{a''}Y_{1-a''}$, respectively, in which a'>a''. In some embodiments, a' is 1, a'' is 0. Accordingly, the metal stack 150 has a gradient composition.

Reference is made to FIG. 1P. A metal gate electrode 160 is formed over the metal stack 150 and fills the space between the metal stack 150. Then, a CMP process may be performed to the metal gate electrode 160, the high-k dielectric layer 144, and the metal stack 150 until the top surface of the inter-layer dielectric layer 136 is exposed. The high-k dielectric layer 144, the metal stack 150, and the metal gate electrode layer 160 may collectively be referred to as a metal gate stack. In some embodiments, the metal stack 150 may also be referred to as a work function metal layer 150.

In some embodiments, the metal gate electrode 160 is made of a conductive material, such as aluminum (Al), copper (Cu), tungsten (W), ruthenium (Ru), cobalt (Co), TaSiN, TaCN, TiAl, TiAlN, or other applicable materials. The metal gate electrode 160 may be deposited by ALD, PVD, CVD, or other suitable processes.

According to the aforementioned embodiments, the work function metal layer may be a metal gate stack including multi-layers, and the layers include at least two elements, in which the concentration percentage of one of the elements gradually decreases from the bottommost layer to the topmost layer of the work function metal layer, and the concentration percentage of another one of the elements gradually increases from the bottommost layer to the topmost layer of the work function metal layer. Accordingly, the threshold voltage ($V_t$) of the metal gate stack may be tuned to a desired value for increasing the $I_{on}$ of the device.

Figure 2:
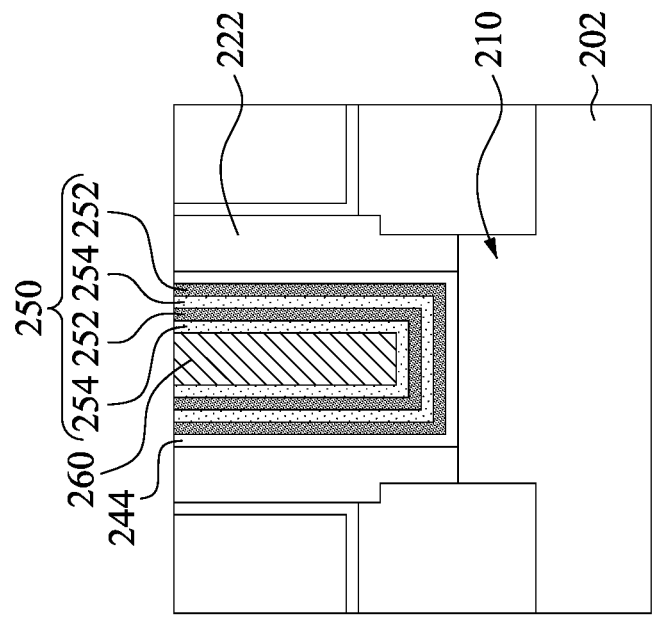
FIG. 2 is a cross-sectional view of a semiconductor device in accordance with some embodiments.

FIG. 2 is a cross-sectional view of a semiconductor device in accordance with some embodiments. FIG. 2 is similar to FIG. 1P, and the difference between the semiconductor devices of FIGS. 2 and 1P pertains to the metal stacks. Thus, some relevant structural and manufacturing details of the semiconductor device of FIG. 2 similar to the semiconductor device of FIGS. 1A to 1P will not be repeated hereinafter.

Reference is made to FIG. 2. A substrate 202 includes a fin structure 210. Spacers 222 are formed over the fin structure 210 of the substrate 202. A high-k dielectric layer 244 is formed over the substrate 202 and in the trench defined by the spacers 222 and the fin structure 210. The high-k dielectric layer 244 is conformal to the spacers 222 and the fin structure 210.

A plurality of first metallic layers 252 and a plurality of second metallic layers 254 are formed over the high-k dielectric layer 244, in which the first metallic layers 252 and the second metallic layers 254 are alternately formed such that the first metallic layers 252 and second metallic layers 254 are alternately stacked on each other. The first metallic layers 252 have substantially the same composition (component), and the second metallic layers 254 have substantially the same composition (component). It is understood that the numbers of layers of the first metallic layers 252 and the second metallic layers 254 used in this example are chosen to facilitate description, and the present disclosure is not limited thereto. In some embodiments, the first metallic layers 252 and the second metallic layers 254 may collectively be referred to as a metal stack 250.

A metal gate electrode 260 is formed over the metal stack 250 and fills the space between the metal stack 250. The metal gate electrode 260 is similar to the metal gate electrode 160 in FIG. 1P, and thus similar descriptions are omitted for brevity.

The materials of the metallic layers 252 and 254 may be similar to the metallic layers 152 to 158 described in FIGS. 1O and 1P. In FIG. 2, the composition of the first metallic layers 252 are $X_{a1}Y_{1-a1}$, and the composition of the second metallic layers 254 are $X_{a2}Y_{1-a2}$. In some embodiments, the concentration percentages a1 and a2 satisfy a1≠a2. That is, the metallic layers 252 and 254 are different in composition. In some other embodiments, the concentration percentages a1, a2 satisfy a1+a2=1. For example, the first metallic layers 252 may be $X_{0.8}Y_{0.2}$, and the second metallic layers 254 may be $X_{0.2}Y_{0.8}$. In still some other embodiments, the concentration percentages a1 and a2 are not equal to 1 and not equal to 0. In the embodiments of FIG. 2, the composition of the metal stack 250 varies periodically.

Figure 3:
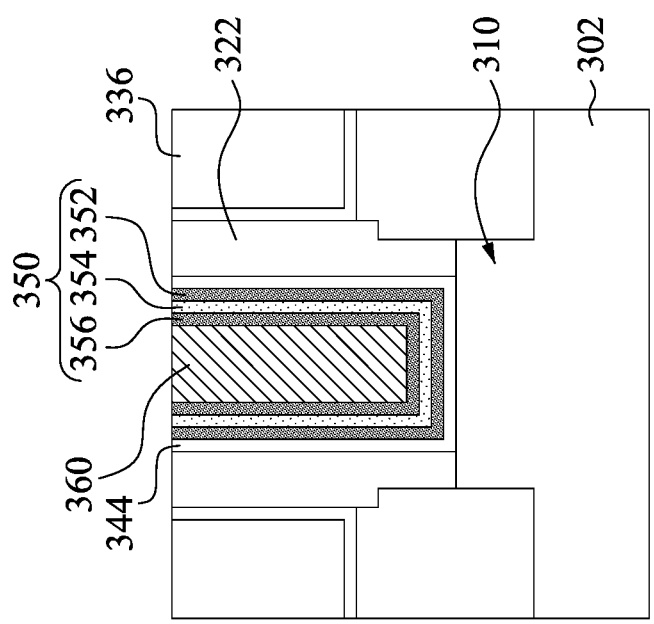
FIG. 3 is a cross-sectional view of a semiconductor device in accordance with some embodiments.

FIG. 3 is a cross-sectional view of a semiconductor device in accordance with some embodiments. FIG. 3 is similar to FIG. 1P, and the difference between the semiconductor devices of FIGS. 3 and 1P pertains to the metal stacks. Thus, some relevant structural and manufacturing details of the semiconductor device of FIG. 3 similar to the semiconductor device of FIGS. 1A to 1P will not be repeated hereinafter.

Reference is made to FIG. 3. A substrate 302 includes a fin structure 310. Spacers 322 are formed over the fin structure 310 of the substrate 302. A high-k dielectric layer 344 is formed over the substrate 302 and in the trench defined by the spacers 322 and the fin structure 310. The high-k dielectric layer 344 is conformal to the spacers 322 and the fin structure 310.

A first metallic layer 352, a second metallic layer 354, and a third metallic layer 356 are formed over the high-k dielectric layer 344, in which the second metallic layer 354 is over the first metallic layer 352, and the third metallic layer 356 is over the second metallic layer 354. In some embodiments, the metallic layers 352 to 356 may collectively be referred to as a metal stack 350. In some embodiments, the first metallic layer 352 and the third metallic layer 356 have different thicknesses. For example, the first metallic layer 352 is thicker than the third metallic layer 356 in some embodiments, and the first metallic layer 352 is thinner than the third metallic layer 356 in some other embodiments.

A metal gate electrode 360 is formed over the metal stack 350 and fills the space between the metal stack 350. The metal gate electrode 360 is similar to the metal gate electrode 160 in FIG. 1P, and thus similar descriptions are omitted for brevity.

The materials of the metallic layers 352 to 356 may be similar to the materials of the metallic layers 152 to 158 described in FIGS. 1O and 1P. In FIG. 3, the composition of the second metallic layer 354 may be Y (i.e., $X_aY_{1-a}$ where a=0). On the other hand, the first metallic layer 352 and the third metallic layer 356 may be $X_aY_{1-a}$, in which a≠0. That is, the first metallic layer 352 and the third metallic layer 356 are compounds, and the second metallic layer 354 is a single element. In some embodiments, the compositions of the first metallic layer 352 and the third metallic layer 356 may be the same, and are different from that of the second metallic layer 354. In some other embodiments, the compositions of the first metallic layer 352 and the third metallic layer 356 may be different.

Figure 4:
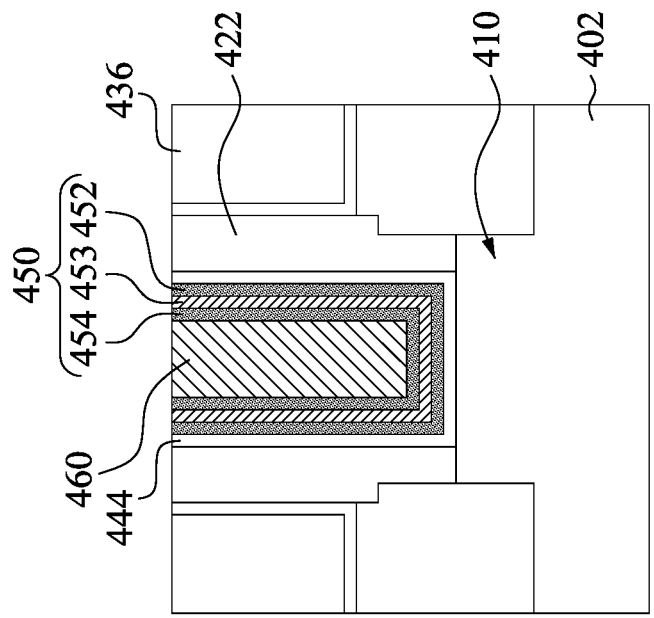
FIG. 4 is a cross-sectional view of a semiconductor device in accordance with some embodiments.

FIG. 4 is a cross-sectional view of a semiconductor device in accordance with some embodiments. FIG. 4 is similar to FIG. 1P and the difference between the semiconductor devices of FIGS. 4 and 1P pertains to the metal stacks. Thus, some relevant structural and manufacturing details of the semiconductor device of FIG. 4 similar to the semiconductor device of FIGS. 1A to 1P will not be repeated hereinafter.

Reference is made to FIG. 4. A substrate 402 includes a fin structure 410. Spacers 422 are formed over the fin structure 410 of the substrate 402. A high-k dielectric layer 444 is formed over the substrate 402 and in the trench defined by the spacers 422 and the fin structure 410. The high-k dielectric layer 444 is conformal to the spacers 422 and the fin structure 410.

A first metallic layer 452 is formed over the high-k dielectric layer 444. Then, a second metallic layer 453 is formed over the first metallic layer 452 by performing a vacuum breaking process. Then, a third metallic layer 454 is formed over the second metallic layer 453. In some embodiments, the first metallic layers 452, the second metallic layer 453, and the third metallic layer 454 may collectively be referred to as a metal stack 450. In some embodiments, the first metallic layer 452 and the third metallic layer 454 have different thicknesses. For example, the first metallic layer 452 is thicker than the third metallic layer 454 in some embodiments, and the first metallic layer 452 is thinner than the third metallic layer 454 in some other embodiments.

In some embodiments, while a vacuum break is occurred in the deposition chamber for forming the metal stack 450, air (such as oxygen) enters the deposition chamber. In other words, the first metallic layer 452 is exposed to the air. The oxygen may react with materials of the exposed layer (i.e., the first metallic layer 452) for forming the second metallic layer 453. As such, the second metallic layer 453 may include oxide. For example, after the first metallic layer 452 is formed, the device may be subject to the air (or an oxygen containing gas mixture) thereby growing a native oxide layer over the first metallic layer 452. In some embodiments, the second metallic layer 453 is an oxide of the first metallic layer 452. In some embodiments, the oxide layer 453 substantially increases the thickness of the oxide layer in the gate structure, and thus makes the gate structure less susceptible to an oxide breakdown. Further, during a post metal gate process, the oxide layer 543 may block the gate structure from damage caused by a high power process, such as plasma treatment. Also, the oxide layer 453 can reduce threshold voltage ($V_t$) variation in different devices under different gate fills. In addition, since part of the work function metal layer, such as the first metallic layer 452, is oxidized, the threshold voltage of the device may be increased, thereby achieving a high $V_t$ (HVT) device.

Since the deposition chamber breaks vacuum during the formation of the oxide layer 453, the formation of the oxide layer 453 is an ex-situ deposition process. In some embodiments, the wafer taken out of the chamber may be at a temperature in a range of between about 250° C. and about 450° C., and the air temperature can be room temperature and atmospheric pressure. In some embodiments, the oxide layer 453 has a thickness in a range from about 5 Å to about 30 Å. In some embodiments, if the thickness of the oxide layer 453 is lower than 5 Å, the oxide layer 453 is not thick enough to provide the above described functions. For example, the oxide layer 453 may be too thin and is unable to reduce threshold voltage (Vt) variation in different devices. On the other hand, if the thickness of the oxide layer 453 is larger than 30 Å, the threshold voltage and the contact resistance of the device is too high, which in turn will lower the device performance.

A metal gate electrode 460 is formed over the metal stack 450 and fills the space between the metal stack 450. The metal gate electrode 460 is similar to the metal gate electrode 160 in FIG. 1P, and thus similar descriptions are omitted for brevity.

The materials of the metallic layers 452 and 454 may be similar to the metallic layers 152 to 158 described in FIGS. 1O and 1P. Due to the presence of the second metallic layer 453, the composition of the metal stack 450 is non-uniform. In some embodiments, the compositions of the first metallic layer 452 and the third metallic layer 454 may be the same. In some other embodiments, the compositions of the first metallic layer 452 and the third metallic layer 454 may be different. For example, the composition of the first metallic layer 452 is X and the composition of the third metallic layer 454 is Y; the composition of the first metallic layer 452 is X and the composition of the third metallic layer 454 is $X_aY_{1-a}$; the composition of the first metallic layer 452 is $X_aY_{1-a}$ and the composition of the third metallic layer 454 is Y; or the first metallic layer 452 and the third metallic layer 454 have other suitable compositions.

Figure 5:
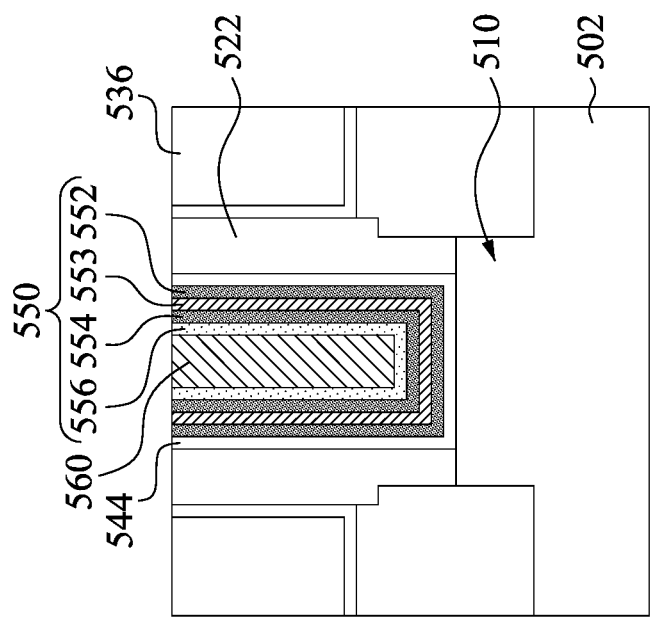
FIG. 5 is a cross-sectional view of a semiconductor device in accordance with some embodiments.

FIG. 5 is a cross-sectional view of a semiconductor device in accordance with some embodiments. FIG. 5 is similar to FIG. 4 and the difference between the semiconductor devices of FIGS. 5 and 4 pertains to the metal stacks. Thus, some relevant structural and manufacturing details of the semiconductor device of FIG. 5 similar to the semiconductor device of FIGS. 1A to 1P and 4 will not be repeated hereinafter.

Reference is made to FIG. 5. A substrate 502 includes a fin structure 510. Spacers 522 are formed over the fin structure 510 of the substrate 502. A high-k dielectric layer 544 is formed over the substrate 502 and in the trench defined by the spacers 522 and the fin structure 510. The high-k dielectric layer 544 is conformal to the spacers 522 and the fin structure 510.

A first metallic layer 552 is formed over the high-k dielectric layer 544. Then, a second metallic layer 553 is formed over the first metallic layer 552. Then, a third metallic layer 554 and a fourth metallic layer 556 are formed over the second metallic layer 553, in which the fourth metallic layer 556 is over the third metallic layer 554. In some embodiments, the first metallic layers 552, the second metallic layer 553, the third metallic layer 554, and the fourth metallic layer 556 may collectively be referred to as a metal stack 550.

A metal gate electrode 560 is formed over the metal stack 550 and fills the space between the metal stack 550. The metal gate electrode 560 is similar to the metal gate electrode 160 in FIG. 1P, and thus similar descriptions are omitted for brevity.

The materials of the metallic layers 552, 554, and 556 may be similar to the materials of the metallic layers 152 to 158 described in FIGS. 1O and 1P. The metallic layer 553 may be similar to the metallic layer 453 in FIG. 4. That is, the metallic layer 553 may be an oxide layer, which is formed by breaking vacuum after forming the metallic layer 552. Due to the presence of the second metallic layer 553, the composition of the metal stack 550 is non-uniform. In some embodiments, the compositions of the first metallic layer 552 and the third metallic layer 554 may be the same, and may be different from that of the fourth metallic layer 556. In some embodiments, the compositions of the first metallic layer 552 and the fourth metallic layer 556 may be the same, and may be different from that of the third metallic layer 554. In some other embodiments, the compositions of the third metallic layer 554 and the fourth metallic layer 556 may be different, but one of the third metallic layer 554 and the fourth metallic layer 556 has a composition that is the same as the composition of the first metallic layer 552.

Figure 6:
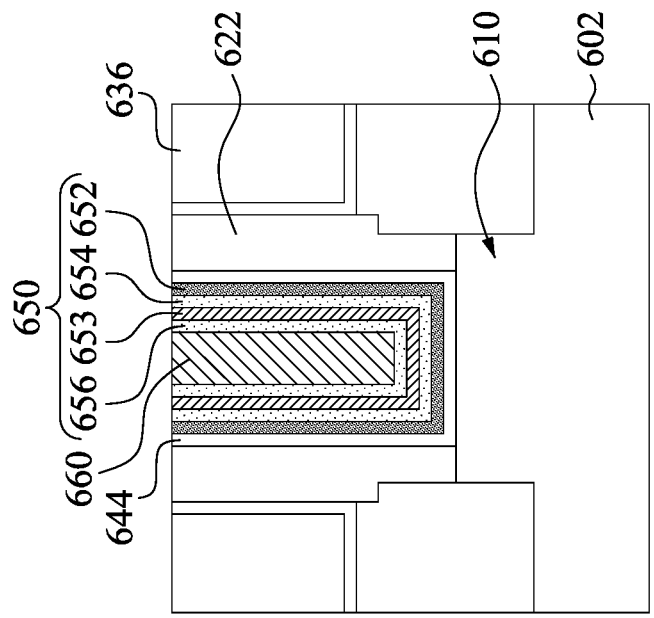
FIG. 6 is a cross-sectional view of a semiconductor device in accordance with some embodiments.

FIG. 6 is a cross-sectional view of a semiconductor device in accordance with some embodiments. FIG. 6 is similar to FIG. 1P, and the difference between the semiconductor devices of FIGS. 6 and 5 pertains to the metal stacks. Thus, some relevant structural and manufacturing details of the semiconductor device of FIG. 6 similar to the semiconductor device of FIGS. 1A to 1P and 5 will not be repeated hereinafter.

Reference is made to FIG. 6. A substrate 602 includes a fin structure 610. Spacers 622 are formed over the fin structure 610 of the substrate 602. A high-k dielectric layer 644 is formed over the substrate 602 and in the trench defined by the spacers 622 and the fin structure 610. The high-k dielectric layer 644 is conformal to the spacers 622 and the fin structure 610.

A first metallic layer 652 and a second metallic layer 654 are formed over the high-k dielectric layer 644, in which the second metallic layer 654 is over the first metallic layer 652. Then, a third metallic layer 653 is formed over the second metallic layer 654. Afterwards, a fourth metallic layer 656 is formed over the third metallic layer 653. In some embodiments, the first metallic layer 652, the second metallic layer 654, the third metallic layer 653, and the fourth metallic layer 656 may collectively be referred to as a metal stack 650.

A metal gate electrode 660 is formed over the metal stack 650 and fills the space between the metal stack 650. The metal gate electrode 660 is similar to the metal gate electrode 160 in FIG. 1P, and thus similar descriptions are omitted for brevity.

The materials of the metallic layers 652, 654, and 656 may be similar to the materials of the metallic layers 152 to 158 described in FIGS. 1O and 1P. The metallic layer 653 may be similar to the metallic layer 453 in FIG. 4. That is, the metallic layer 653 may be an oxide layer, which is formed by breaking vacuum after forming the metallic layer 654. Due to the presence of the third metallic layer 653, the composition of the metal stack 650 is non-uniform. In some embodiments, the compositions of the first metallic layer 652 and the fourth metallic layer 656 may be the same, and may be different from that of the second metallic layer 654. In some embodiments, the compositions of the second metallic layer 654 and the fourth metallic layer 656 may be the same, and may be different from that of the first metallic layer 652. In some other embodiments, the compositions of the first metallic layer 652 and the second metallic layer 654 may be different, but one of the first metallic layer 652 and the second metallic layer 654 has a composition that is the same as the composition of the fourth metallic layer 656.

According to the aforementioned embodiments, a work function metal layer of a metal gate stack is formed to have layered composition. The profile of the composition of the metal stack can be step-like, gradient, or periodical cycle. As such, the threshold voltage of the device may be adjusted flexibly, the on-current ($I_{on}$) may be increased, and the device reliability may be improved, accordingly. Further, since the work function metal layer is formed by depositing multiple layers, the small gate fill reliability may be improved. Also, since a low $V_t$ (LVT) device, a standard $V_t$ (SVT) device, and a high $V_t$ (HVT) device may include different gate fill windows, the multiple layers can benefit the Vt adjustment, and also benefit Vt control between different gate length ($L_g$) devices.

In some embodiments of the present disclosure, a semiconductor device includes a substrate, a gate stack, and a gate electrode. The substrate includes a semiconductor fin. The gate stack is disposed on the semiconductor fin, in which the gate stack includes a dielectric layer disposed over the semiconductor fin, and a metal stack disposed over the dielectric layer. The metal stack has a first metallic layer and a second metallic layer over the first metallic layer, in which the first metallic layer and the second metallic layer have a first element, and a percentage of the first element in the first metallic layer is greater than that in the second metallic layer. The gate electrode is disposed over the metal stack.

According to some embodiments, the metal stack further includes a third metallic layer having the first element over the second metallic layer, and a percentage of the first element in the third metallic layer is greater than that in the second metallic layer.

According to some embodiments, the metal stack further includes a fourth metallic layer having the first element over the third metallic layer, and a percentage of the first element in the fourth metallic layer is greater than that in the third metallic layer.

According to some embodiments, the metal stack further includes a third metallic layer having the first element over the second metallic layer, and a percentage of the first element in the third metallic layer is lower than that in the second metallic layer.

According to some embodiments, the metal stack further includes a fourth metallic layer having the first element over the third metallic layer, and a percentage of the first element in the fourth metallic layer is lower than that in the third metallic layer.

According to some embodiments, the metal stack further includes a third metallic layer having the first element over the second metallic layer, and a percentage of the first element in the third metallic layer is substantially equal to that in the first metallic layer.

According to some embodiments, the third metallic layer is thicker than the first metallic layer.

According to some embodiments, the metal stack further includes an oxide layer between the first metallic layer and the second metallic layer.

In some embodiments of the present disclosure, a semiconductor device includes a substrate, a plurality of spacers, a dielectric layer, a plurality of metallic layers. The substrate includes a semiconductor fin. The spacers are disposed over the semiconductor fin. The dielectric layer is disposed over the semiconductor fin and between the spacers. The metallic layers are disposed over the dielectric layer, in which the metallic layers respectively have compositions $X_{a1}Y_{1-a1}$, $X_{a2}Y_{1-a2}$ ... $X_{an}Y_{1-an}$, and the composition $X_{an}Y_{1-an}$ substantially satisfy $X_{a(n-1)}Y_{1-a(n-1)} \neq X_{an}Y_{1-an}$.

According to some embodiments, the compositions $X_{a1}Y_{1-a1}, X_{a2}Y_{1-a2} \ldots X_{an}Y_{1-an}$ satisfy a1>a2> ... >an.

According to some embodiments, the compositions $X_{a1}Y_{1-a1}, X_{a2}Y_{1-a2} \ldots X_{an}Y_{1-an}$ satisfy a1=a3= ... =a(2i−1) (i is an integer), and a2=a4= ... =a2i (i is an integer).

According to some embodiments, a(2i−1) a2i (i is an integer).

According to some embodiments, a2i=0.

According to some embodiments, the semiconductor device further includes an oxide layer between two adjacent layers of the metallic layers.

According to some embodiments, at least two of the metallic layers have different thickness.

In some embodiments of the present disclosure, a method includes forming a gate stack over a fin structure of a substrate, in which forming the gate stack includes forming a dielectric layer over the fin structure; forming a first metallic layer having a first element; a second metallic layer having the first element over the first metallic layer, in which a percentage of the first element in the first metallic layer is greater than that in the second metallic layer, and forming the first and second metallic layers are in-situ performed in a same chamber; and forming a gate electrode over the second metallic layer.

According to some embodiments, the method further includes forming the first metallic layer and the second metallic layer in an alternating manner.

According to some embodiments, the method further includes forming a third metallic layer having the first element over the first metallic layer, in which a percentage of the first element in the third metallic layer is greater than that in the second metallic layer.

According to some embodiments, the first metallic layer is a compound, and the second metallic layer is a single element.

According to some embodiments, the method further includes exposing the second metallic layer to an air.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate comprising a semiconductor fin; and
a gate stack disposed on the semiconductor fin, wherein the gate stack comprises:
    a dielectric layer disposed over the semiconductor fin;
    a metal stack disposed over the dielectric layer and having a first metallic layer and a second metallic layer over the first metallic layer, wherein the first metallic layer is a metal compound of a first element and a second element and the second metallic layer is a single-element metal of the second element, and wherein the metal stack further comprises an oxide layer between the first metallic layer and the second metallic layer; and
    a gate electrode disposed over the metal stack.

2. The semiconductor device of claim 1, wherein the metal stack further comprises a third metallic layer having the first element over the second metallic layer, and the third metallic layer is a metal compound of the first element and the second element.

3. The semiconductor device of claim 2, wherein the metal stack further comprises a fourth metallic layer having the first element over the third metallic layer, and a percentage of the first element in the fourth metallic layer is greater than that in the third metallic layer.

4. The semiconductor device of claim 2, wherein a composition of the first metallic layer and a composition of the third metallic layer are the same.

5. The semiconductor device of claim 2, wherein a composition of the first metallic layer and a composition of the third metallic layer are different.

6. The semiconductor device of claim 2, wherein the dielectric layer is made of high-k material, the dielectric layer has a U-shape cross-section, and the dielectric layer is in contact with the semiconductor fin.

7. The semiconductor device of claim 1, wherein the metal stack further comprises a third metallic layer having the first element over the second metallic layer, and a percentage of the first element in the third metallic layer is substantially equal to that in the first metallic layer.

8. The semiconductor device of claim 7, wherein the third metallic layer is thicker than the first metallic layer.

9. The semiconductor device of claim 1, wherein the oxide layer has a thickness in a range from about 5 Å to about 30 Å.

10. The semiconductor device of claim 9, wherein thicknesses of the first and second metallic layers are in a range from about 5 Å to about 15 Å.

11. The semiconductor device of claim 1, wherein thicknesses of the first and second metallic layers are in a range from about 5 Å to about 15 Å.

12. A semiconductor device, comprising:
a substrate comprising a semiconductor fin;
a plurality of spacers disposed over the semiconductor fin;
a dielectric layer disposed over the semiconductor fin and between the spacers; and
a work function metal stack comprising alternately stacked first work function metal layers and second work function metal layers, wherein the first work function metal layers have a composition of $X_{a1}Y_{1-a1}$ and the second work function metal layers have a composition of $X_{a2}Y_{1-a2}$, and a1≠a2.

13. The semiconductor device of claim 12, wherein the first and second work function metal layers have a U-shape cross-section.

14. The semiconductor device of claim 12, wherein a1+a2=1.

15. The semiconductor device of claim 12, wherein thicknesses of the first and second work function metal layers are in a range from about 5 Å to about 15 Å.

16. A method, comprising:
forming a dummy gate stack over a fin structure of a substrate;
forming gate spacers on opposite sidewalls of the dummy gate stack;
removing the dummy gate stack to form a trench between the gate spacers; and
after removing the dummy gate stack, forming a gate stack in the trench between the gate spacers, wherein forming the gate stack comprises:
    forming a dielectric layer over the fin structure;
    forming a first metallic layer having a first element;
    forming a second metallic layer having the first element over the first metallic layer, wherein the first metallic layer has a composition of $X_{a1}Y_{1-a1}$ and the second metallic layer has a composition of $X_{a2}Y_{1-a2}$, and a1+a2=1, and wherein forming the first and second metallic layers are in-situ performed in a same chamber; and
    forming a gate electrode over the second metallic layer.

17. The method of claim 16, further comprising forming the first metallic layer and the second metallic layer in an alternating manner.

18. The method of claim 16, further comprising forming a third metallic layer having the first element over the first metallic layer, wherein a percentage of the first element in the third metallic layer is greater than that in the second metallic layer.

19. The method of claim 16, wherein the first metallic layer is a compound, and the second metallic layer is a single element.

20. The method of claim 16, further comprising exposing the second metallic layer to air.

\* \* \* \* \*